United States Patent
Toyoda et al.

(10) Patent No.: US 12,214,438 B2
(45) Date of Patent: Feb. 4, 2025

(54) SPATTER DETECTION METHOD

(71) Applicant: HONDA MOTOR CO., LTD., Tokyo (JP)

(72) Inventors: Hiroki Toyoda, Tokyo (JP); Xihao Tan, Tokyo (JP); Hitoshi Saito, Tokyo (JP); Shinya Watanabe, Tokyo (JP)

(73) Assignee: HONDA MOTOR CO., LTD., Tokyo (JP)

(*) Notice: Subject to any disclaimer, the term of this patent is extended or adjusted under 35 U.S.C. 154(b) by 140 days.

(21) Appl. No.: 18/180,872

(22) Filed: Mar. 9, 2023

(65) Prior Publication Data

US 2023/0311234 A1 Oct. 5, 2023

(30) Foreign Application Priority Data

Mar. 31, 2022 (CN) .......................... 202210346167.8

(51) Int. Cl.
*B23K 11/25* (2006.01)
*B23K 31/12* (2006.01)
*G01R 29/02* (2006.01)

(52) U.S. Cl.
CPC .......... *B23K 11/257* (2013.01); *B23K 31/125* (2013.01); *G01R 29/023* (2013.01)

(58) Field of Classification Search
CPC ...... G01R 29/00; G01R 29/02; G01R 29/023; B23K 11/00; B23K 11/10; B23K 11/11; B23K 11/115; B23K 11/24; B23K 11/25; B23K 11/252; B23K 11/257; B23K 31/00; B23K 31/12; B23K 31/125
USPC ......................................................... 324/71.1
See application file for complete search history.

(56) References Cited

U.S. PATENT DOCUMENTS

| | | | | | |
|---|---|---|---|---|---|
| 4,359,622 A | * | 11/1982 | Dostoomian | ........ | B23K 11/252 |
| | | | | | 219/110 |
| 2021/0187654 A1 | | 6/2021 | Saito et al. | | |

FOREIGN PATENT DOCUMENTS

| | | | | | |
|---|---|---|---|---|---|
| CN | 116921831 A | * | 10/2023 | ........... | B23K 11/257 |
| JP | 2002316269 A | * | 10/2002 | ............. | B23K 11/25 |
| WO | WO-2007039543 A1 | * | 4/2007 | ............. | B23K 11/25 |
| WO | 2020050011 A1 | | 3/2020 | | |

\* cited by examiner

*Primary Examiner* — Hoai-An D. Nguyen
(74) *Attorney, Agent, or Firm* — CKC & Partners Co. LLC

(57) ABSTRACT

A spot welding method includes supplying a welding current having a pulse-shaped waveform to a workpiece by alternately executing a step of maintaining the welding current within a set peak current range and a step of decreasing the welding current from the peak current range toward a bottom current and then increasing the welding current toward the peak current range when an effective value of the welding current reaches a set target range for a plurality of cycles. The spatter detection method includes measuring a pulse width $IW(1)$, $IW(2)$, ... in each cycle of the pulse-shaped waveform and detecting the occurrence of spatter when a pulse width difference $D(M)=IW(M)-IW(M-1)$ between a pulse width $IW(M)$ in a target cycle (M-th cycle) and a pulse width $IW(M-1)$ in a cycle immediately before the target cycle exceeds a width threshold value $Dth$.

4 Claims, 11 Drawing Sheets

SPATTER DETECTION METHOD

This application is based on and claims the benefit of priority from Chinese Patent Application No. 202210346167.8, filed on 31 Mar. 2022, the content of which is incorporated herein by reference.

BACKGROUND OF THE INVENTION

Field of the Invention

The present invention relates to a spatter detection method. More specifically, the present invention relates to a spatter detection method for detecting an occurrence of spatter in spot welding.

Related Art

In the case of welding a plurality of metal plates to each other, spot welding using a spot welding apparatus is performed. In spot welding, power is distributed between a pair of electrode chips in a state in which the plurality of metal plates as workpieces are sandwiched between the pair of electrode chips, and in this manner, a nugget is generated between the plurality of metal plates to weld the plurality of metal plates.

In a spot welding method proposed by the applicant disclosed in Patent Document 1, a welding current having a pulse-shaped waveform is supplied to a plurality of metal plates over a plurality of cycles in a state in which the plurality of metal plates is sandwiched by a pair of electrodes, and in this manner, the plurality of metal plates is welded to each other.

Patent Document 1: PCT International Publication No. WO2020/050011

SUMMARY OF THE INVENTION

In spot welding, while a welding current is supplied to a metal plate, a phenomenon called "spatter" occurs in which part of the metal plate is molten and scattered. When the spatter occurs, welding strength may decrease, and thus it is preferable to detect the spatter immediately when the spatter occurs.

When such spatter occurs, a voltage between a pair of electrode chips drops sharply in that moment. For this reason, according to the conventional spatter detection method, the occurrence of spatter is often detected based on the change in the voltage between the pair of electrode chips. However, in this case, it is necessary to provide a voltage detection line for detecting a voltage in the vicinity of the electrode chips, which may increase costs.

An object of the present invention is to provide a spatter detection method capable of detecting an occurrence of spatter in spot welding without newly providing a voltage detection line.

(1) A spatter detection method according to the present invention is a method for detecting an occurrence of spatter in a spot welding method for joining a workpiece (e.g., a workpiece W to be described below) by supplying a welding current. The spot welding method includes supplying the welding current having a pulse-shaped waveform by alternately executing a step of maintaining the welding current within a set peak current range and a step of decreasing the welding current from the peak current range toward a bottom current and then increasing the welding current toward the peak current range when an effective value of the welding current reaches a set target range for a plurality of cycles. The spatter detection method includes measuring a pulse width (e.g., a pulse width IW(N) to be described below) in each of the cycle of the pulse-shaped waveform and detecting the occurrence of spatter when a difference (e.g., a pulse width difference D(M) to be described below) between the pulse width in a target cycle and the pulse width in a cycle immediately before the target cycle exceeds a predetermined width (e.g., a width threshold value Dth to be described below).

(2) In this case, preferably, the spatter detection method includes, when the occurrence of spatter is detected, estimating a quality of a product manufactured by welding the workpiece based on a timing at which the occurrence of the spatter is detected.

(3) In this case, preferably, the spot welding method includes fixing a slope time, which is a combination of a current rise time until the welding current reaches the peak current range from the bottom current and a peak holding time during which the welding current is maintained within the peak current range.

(1) When the spatter occurs during the spot welding, the plate-to-plate resistance of the workpiece drops sharply. Therefore, when the spatter occurs while the workpiece is joined by supplying the welding current having the pulse-shaped waveform to the workpiece, the plate-to-plate resistance of the workpiece drops sharply, and thus the time constant lengthens sharply when the welding current decreases from the peak current range to the bottom current. For this reason, when the welding current having the pulse-shaped waveform is supplied by current control, which causes the welding current to rise toward the peak current range, in the case where the effective value of the welding current reaches the target range, the difference increases between the pulse width of the welding current in the cycle in which the spatter occurs and the pulse width of the welding current in the cycle before the spatter occurs. By utilizing such a phenomenon in the present invention, it is possible to detect the occurrence of spatter without newly providing a voltage detection line. In the present invention, the occurrence of spatter is detected based on the comparison of the pulse width in the target cycle with the pulse width in the cycle immediately before the target cycle, whereby it is possible to detect the occurrence of spatter without prior knowledge of the difference in material characteristics of the workpiece to be welded and the influence of the welding equipment.

(2) When the detection timing of the occurrence of spatter is a former period of welding, since the welding diameter can be expected to grow due to the subsequent power distribution, sufficient welding strength of the product can be ensured. On the other hand, when the detection timing of the occurrence of spatter is a latter stage of the welding, since the welding diameter cannot be expected to grow due to the subsequent power distribution, the sufficient welding strength of the product may not be ensured. By utilizing such a fact in the present invention, the quality of the product is estimated based on the detection timing of the occurrence of spatter. Thereby, it is not necessary to visually inspect the quality of all the products, in which the spatter occurs during the welding, again, and thus the number of man-hours for inspection after the welding can be reduced.

(3) When the spatter occurs as described above, the plate-to-plate resistance drops sharply, and thus the current falling time until the welding current decreases from the peak current range to the bottom current lengthens. In the present invention, for this reason, the slope time is fixed over all cycles, and thus the change in the current falling time caused by the occurrence of spatter can be reflected in the change in the pulse width, whereby the occurrence of spatter can be detected with higher accuracy, the slope time being a combination of the current rise time until the welding current reaches the peak current range from the bottom current and the peak holding time during which the welding current is maintained within the peak current range.

DETAILED DESCRIPTION OF THE INVENTION

Figure 1:
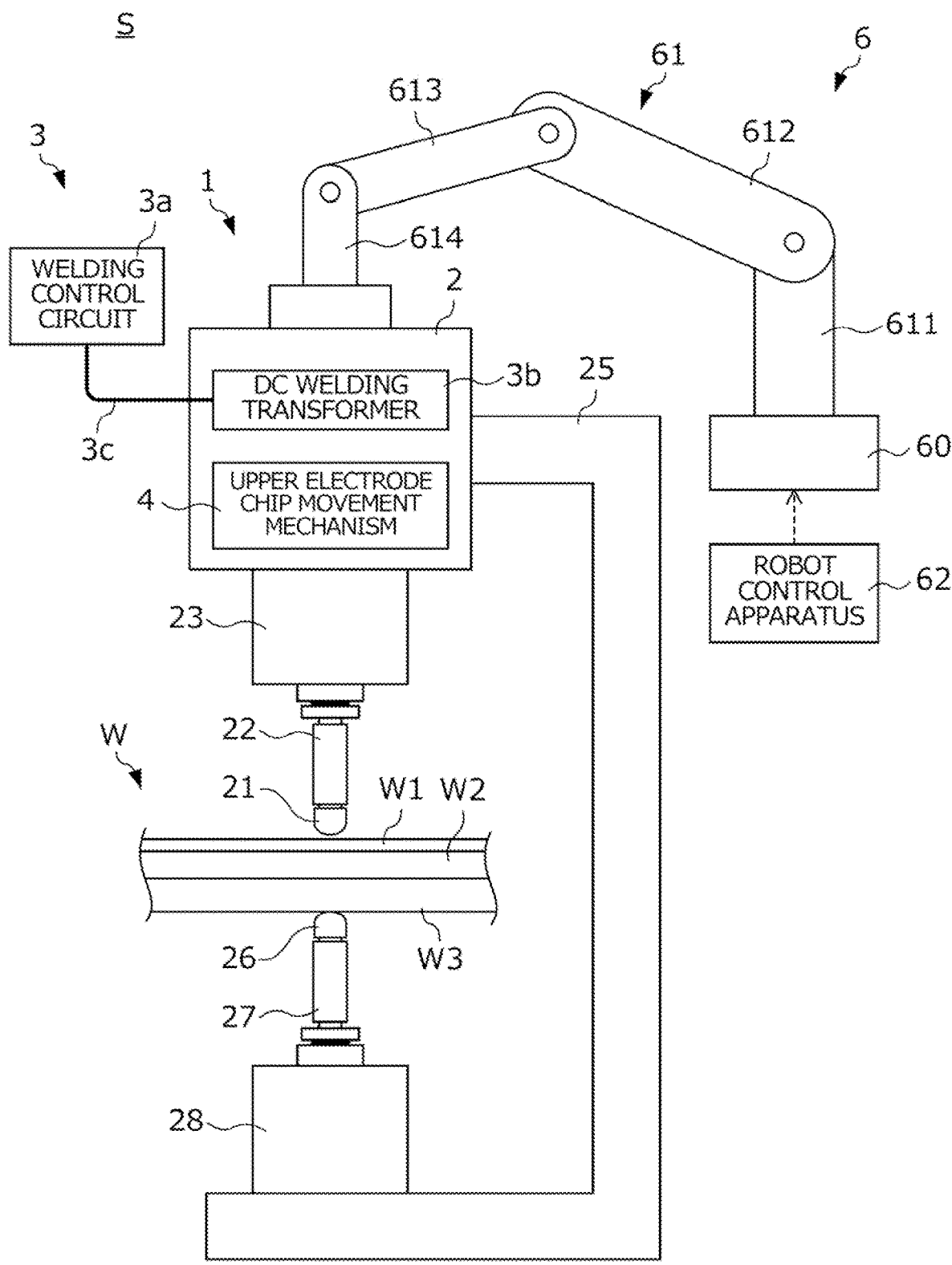
FIG. 1 is a view showing a configuration of a welding system to which a spot welding method according to one embodiment of the present invention is applied.

Hereinafter, one embodiment of the present invention will be described with reference to the drawings. FIG. 1 is a view showing a configuration of a welding system S to which a spot welding method and a spatter detection method according to the present embodiment is applied.

The welding system S includes a spot welding apparatus 1 as a welding gun, a workpiece W as a multilayer body of metal plates joined to each other by the spot welding apparatus 1, and a robot 6 supporting the spot welding apparatus 1.

The workpiece W is a multilayer body configured such that a plurality of metal plates is stacked on each other. In the present embodiment, a case where a first metal plate W1, a second metal plate W2, and a third metal plate W3 as three metal plates are stacked on each other in this order from the top to the bottom to form a multilayer body as the workpiece W will be described, but the present invention is not limited to such a case. The number of metal plates forming the workpiece W may be two or four or more. A case will be described below in which a thickness of the first metal plate W1 is thinner than a thickness of each of the second metal plate W2 and the third metal plate W3 and the first metal plate W1, the second metal plate W2, and the third metal plate W3 are made of the same metal, but the present invention is not limited thereto. At least one metal plate of these metal plates W1 to W3 may have a rigidity different from those of the other metal plates.

The robot 6 includes a robot body 60 attached to a floor surface, an articulated arm 61 pivotally supported on the robot body 60, and a robot control apparatus 62 that controls the robot 6. The articulated arm 61 includes a first arm portion 611 pivotally supported on a base end side by the robot body 60, a second arm portion 612 pivotally supported on a base end side by the first arm portion 611, a third arm portion 613 pivotally supported on a base end side by the second arm portion 612, and a fourth arm portion 614 pivotally supported on a base end side by the third arm portion 613 and attached to the spot welding apparatus 1 on a tip end side.

The robot control apparatus 62 drives a plurality of motors provided at the robot body 60 and the articulated arm 61 to drive each of the arm portions 611 to 614, thereby controlling the position and orientation of the spot welding apparatus 1 attached to the fourth arm portion 614 and moving later-described electrode chips 21, 26 provided at the spot welding apparatus 1 to a joint portion of the workpiece W.

The spot welding apparatus 1 includes a welding power circuit 3 as a welding current supply source, a gun body 2 on which a later-described upper electrode chip movement mechanism 4 and part of the welding power circuit 3 are mounted, the upper electrode chip 21 and the lower electrode chip 26 as a pair of electrodes, an upper electrode chip support portion 22, an upper adaptor body 23, a gun arm 25, a lower electrode chip support portion 27, and a lower adaptor body 28.

The upper electrode chip support portion 22 is in the shape of a rod extending along the vertical direction, and the upper electrode chip 21 is attached to a tip end portion of the upper electrode chip support portion 22. The upper adaptor body 23 is in a columnar shape, and connects the gun body 2 and the upper electrode chip support portion 22 to each other. The upper adaptor body 23 is, relative to the gun body 2, provided slidably along a sliding direction parallel with the axis of the upper electrode chip support portion 22.

The gun arm 25 extends to curve from the gun body 2 to below the upper electrode chip 21 in the vertical direction. The lower electrode chip support portion 27 is in the shape of a rod coaxial with the upper electrode chip support portion 22, and the lower electrode chip 26 is attached to a tip end portion of the lower electrode chip support portion 27. The lower adaptor body 28 is in a columnar shape, and connects a tip end portion of the gun arm 25 and the lower electrode chip support portion 27 to each other. As shown in FIG. 1, the lower electrode chip 26 is supported by the lower electrode chip support portion 27 to face the upper electrode chip 21 with a predetermined clearance along the axes of the chip support portions 22, 27.

The upper electrode chip movement mechanism 4 includes a cylinder, a control apparatus therefor, etc., and together with the upper electrode chip support portion 22 and the upper electrode chip 21, moves the upper adaptor body 23 back and forth along the sliding direction. With this configuration, the upper electrode chip 21 can contact an upper surface of the workpiece W with the lower electrode chip 26 contacting a lower surface of the workpiece W, and the workpiece W can be further sandwiched and pressurized by these electrode chips 21, 26.

Figure 2:
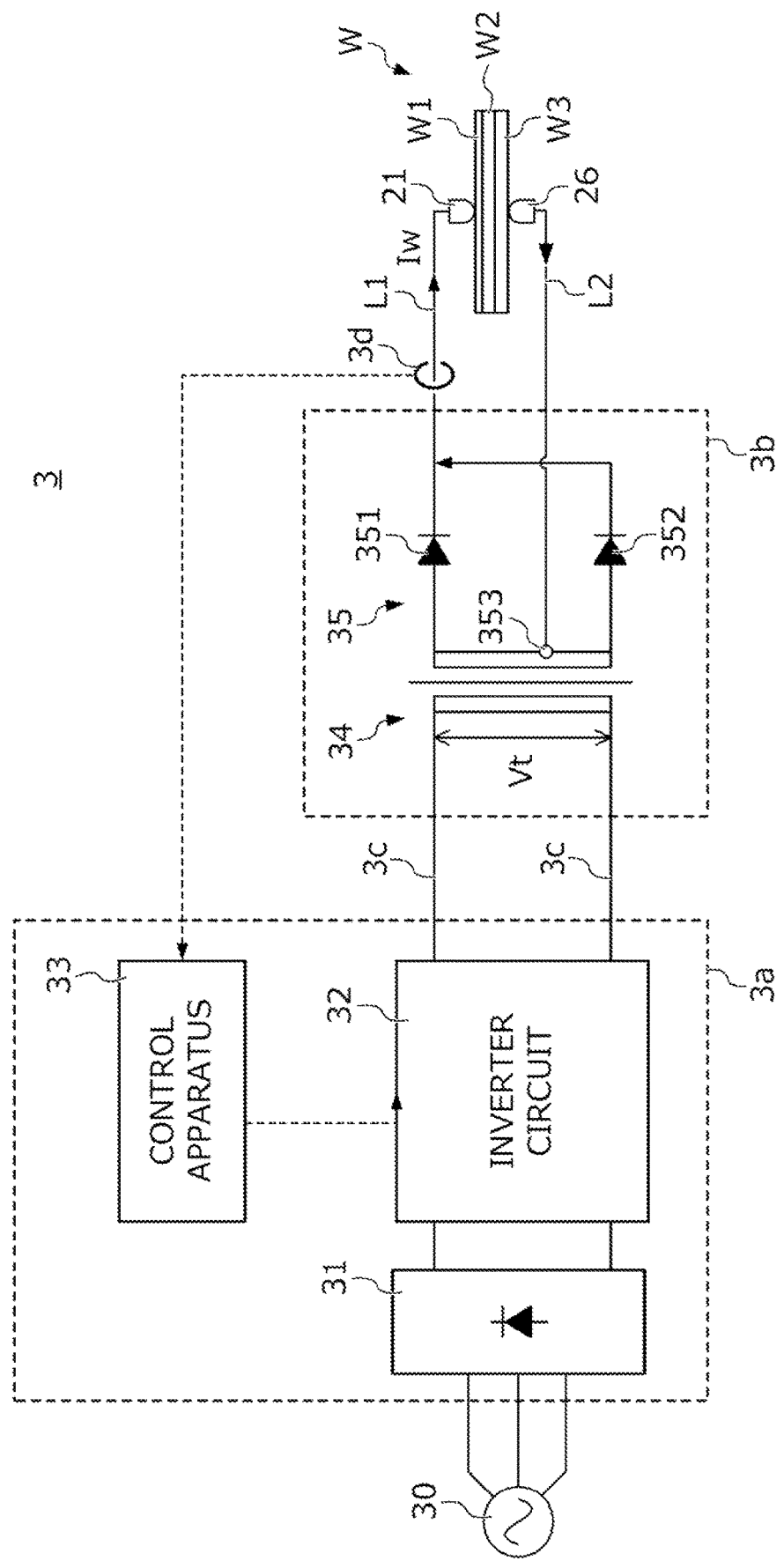
FIG. 2 is a diagram showing a circuit configuration of a welding power circuit.

FIG. 2 is a diagram showing a circuit configuration of the welding power circuit 3. The welding power circuit 3 includes a welding control circuit 3a, a DC welding transformer 3b, power cables 3c, and a current sensor 3d. The welding power circuit 3 is connected to the upper electrode chip 21 and the lower electrode chip 26 through power lines L1, L2. As shown in FIG. 1, the DC welding transformer 3b and the current sensor 3d of the welding power circuit 3 configured as described above are mounted on the gun body 2. Moreover, the welding control circuit 3a of the welding power circuit 3 is mounted on a base separated from the gun body 2, and is connected to the DC welding transformer 3b through the power cables 3c. With this configuration, the weight of the gun body 2 can be reduced.

The welding control circuit 3a includes a converter circuit 31, an inverter circuit 32, and a control apparatus 33. The DC welding transformer 3b includes a transformer 34 and a rectification circuit 35.

The converter circuit 31 performs full-wave rectification for a three-phase power input from a three-phase power source 30, thereby converting the three-phase power into a DC power and supplying the DC power to the inverter circuit 32.

The inverter circuit 32 converts the DC power input from the converter circuit 31 into a single-phase AC power, thereby outputting the single-phase AC power to the transformer 34 through the power cables 3c. More specifically, the inverter circuit 32 includes four bridge-connected switching elements. The inverter circuit 32 turns on or off these switching elements according to a gate drive signal transmitted from a gate drive circuit mounted on the control apparatus 33, thereby converting the DC power into the single-phase AC power.

The transformer 34 transforms the AC power input from the inverter circuit 32, thereby outputting the transformed AC power to the rectification circuit 35. The rectification circuit 35 rectifies the AC power input from the transformer 34, thereby outputting a DC power to between the electrode chips 21, 26 each connected to the power lines L1, L2. For example, a known full-wave rectification circuit including a combination of two rectification diodes 351, 352 and a center tap 353 is used as the rectification circuit 35.

The current sensor 3d detects a welding current supplied from the welding power circuit 3 to the chips 21, 26. The current sensor 3d is, for example, provided on the power line L1 connecting the rectification circuit 35 and the upper electrode chip 21 to each other, and to the control apparatus 33, transmits a current detection signal according to the level of the welding current flowing in the power line L1.

The control apparatus 33 includes, for example, a microcomputer that executes welding current control, spatter detection processing, etc., as described later by means of the current detection signal transmitted from the current sensor 3d and the gate drive circuit that generates the gate drive signal according to an arithmetic processing result of the microcomputer to transmit the gate drive signal to the inverter circuit 32.

Figure 3:
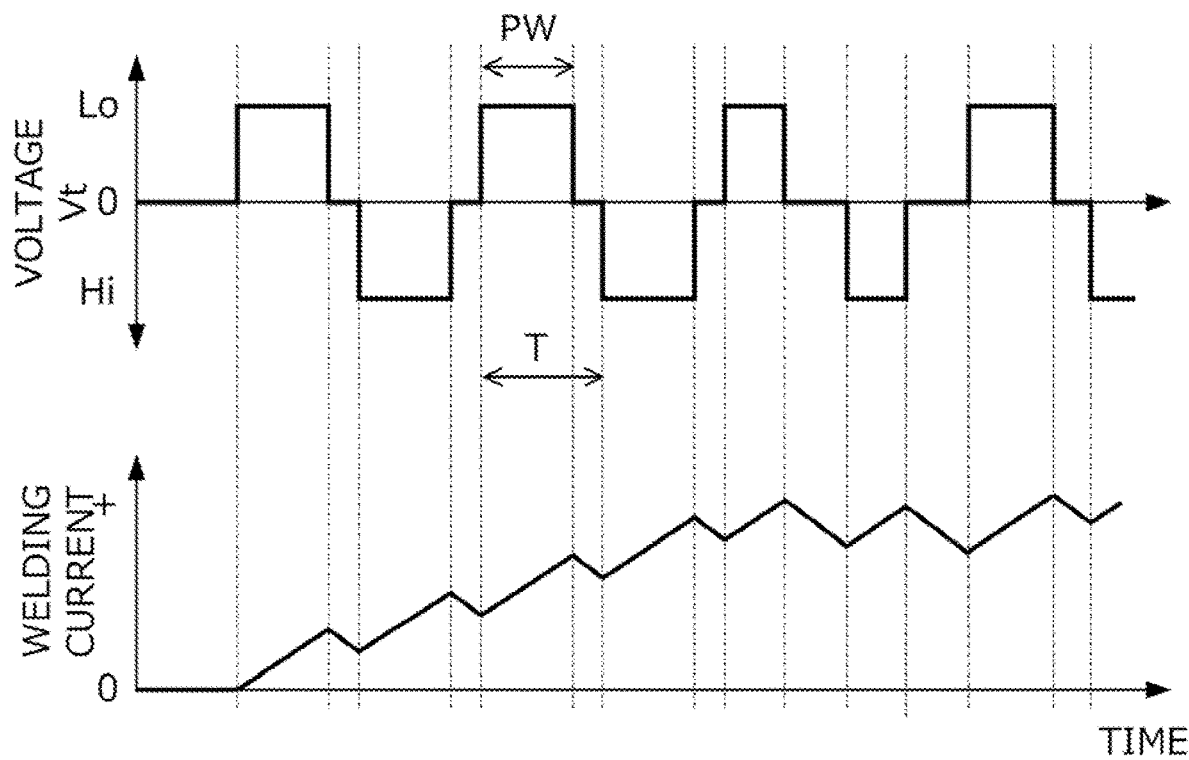
FIG. 3 is a graph showing a relationship between an AC voltage input from an inverter circuit to a transformer and a welding current applied to a pair of electrode chips in the welding power circuit.

FIG. 3 is a graph showing a relationship between an AC voltage Vt input from the inverter circuit 32 to the transformer 34 and the welding current Iw applied to the electrode chips 21, 26 in the welding power circuit 3 as described above.

When the inverter circuit 32 is driven, the AC voltage Vt in the shape of a square wave as shown in FIG. 3 is outputted from the inverter circuit 32. The AC voltage output from the inverter circuit 32 is transformed in the transformer 34, and is further rectified in the rectification circuit 35. Then, the DC welding current Iw is applied to the workpiece W through the electrode chips 21, 26.

As shown in FIG. 3, the welding current Iw increases as a duty cycle increases, the duty cycle being the ratio of a pulse width PW as a period in which the AC voltage Vt is Hi or Lo to a predetermined carrier cycle T. As described later with reference to FIGS. 5 and 6, the control apparatus 33 determines the pulse width PW according to a known feedback control rule such as PI control such that the output current of the welding power circuit 3 detected by the current sensor 3d reaches a target current set by not-shown processing, and performs ON/OFF drive of the plurality of switching elements in the inverter circuit 32 by PWM control with the duty cycle set according to the pulse width PW.

Next, the steps of the spot welding method for joining the workpiece W by the welding system S as described above will be described.

First, as shown in FIG. 1, the robot control apparatus 62 drives the robot body 60 and the articulated arm 61, thereby controlling the position and posture of the spot welding apparatus 1 such that the workpiece W is arranged between the upper electrode chip 21 and the lower electrode chip 26. At this point, the robot control apparatus 62 controls the position and posture of the spot welding apparatus 1 such that the lower electrode chip 26 contacts a lower surface of the third metal plate W3 of the workpiece W.

Figure 4:
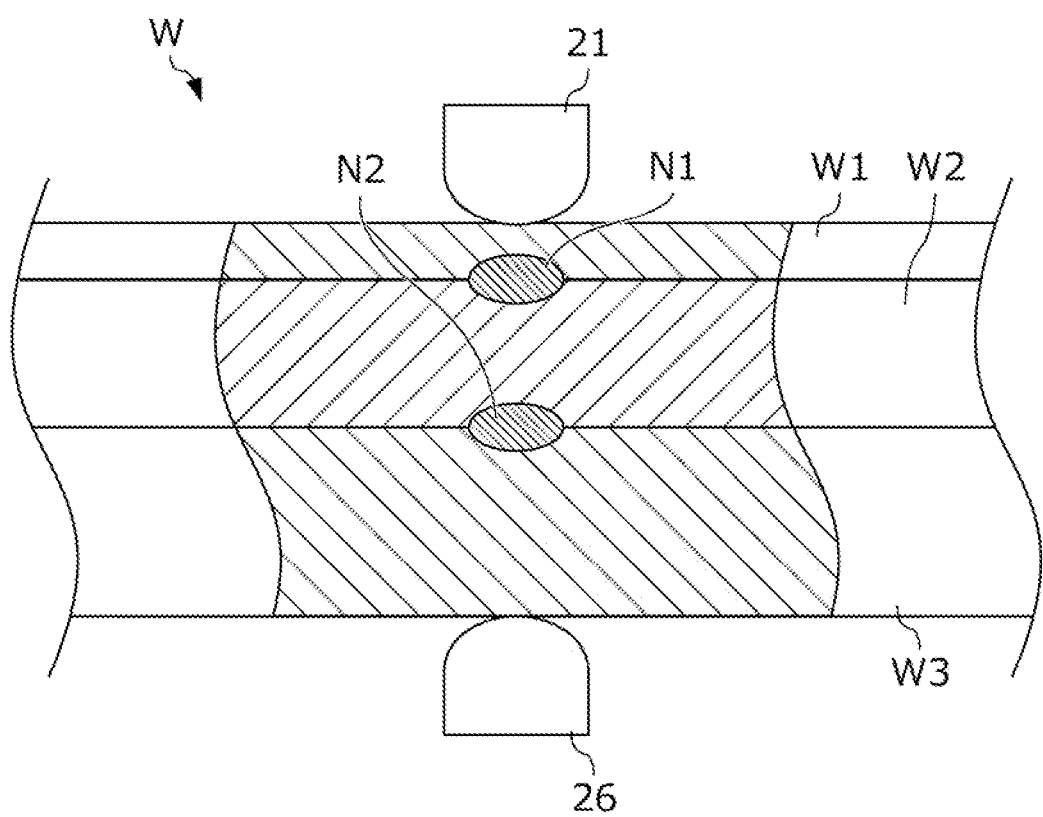
FIG. 4 is a view schematically showing the section of a workpiece during welding, FIG. 4 showing the view in a state in which the welding current is applied to the workpiece while the workpiece is sandwiched and pressurized by the upper electrode chip and the lower electrode chip.

Next, as shown in FIG. 4, the upper adaptor body 23 is slid using the upper electrode chip movement mechanism 4 such that the upper electrode chip 21 approaches the lower electrode chip 26. When the upper electrode chip 21 approaches the lower electrode chip 26 and comes into contact with an upper surface of the first metal plate W1, the workpiece W is sandwiched and pressurized by the upper electrode chip 21 and the lower electrode chip 26.

Next, the control apparatus 33 of the welding power circuit 3 executes the welding current control by the steps described with reference to FIG. 5 while maintaining a state in which the workpiece W is pressurized from both sides by the electrode chips 21, 26, and applies the pulse-shaped welding current to between the upper electrode chip 21 and the lower electrode chip 26. In this manner, as shown in FIG. 4, a first nugget N1 is formed between the first metal plate W1 and the second metal plate W2, and a second nugget N2 is formed between the second metal plate W2 and the third metal plate W3. Thus, the first to third metal plates W1 to W3 are welded to each other.

Figure 5:
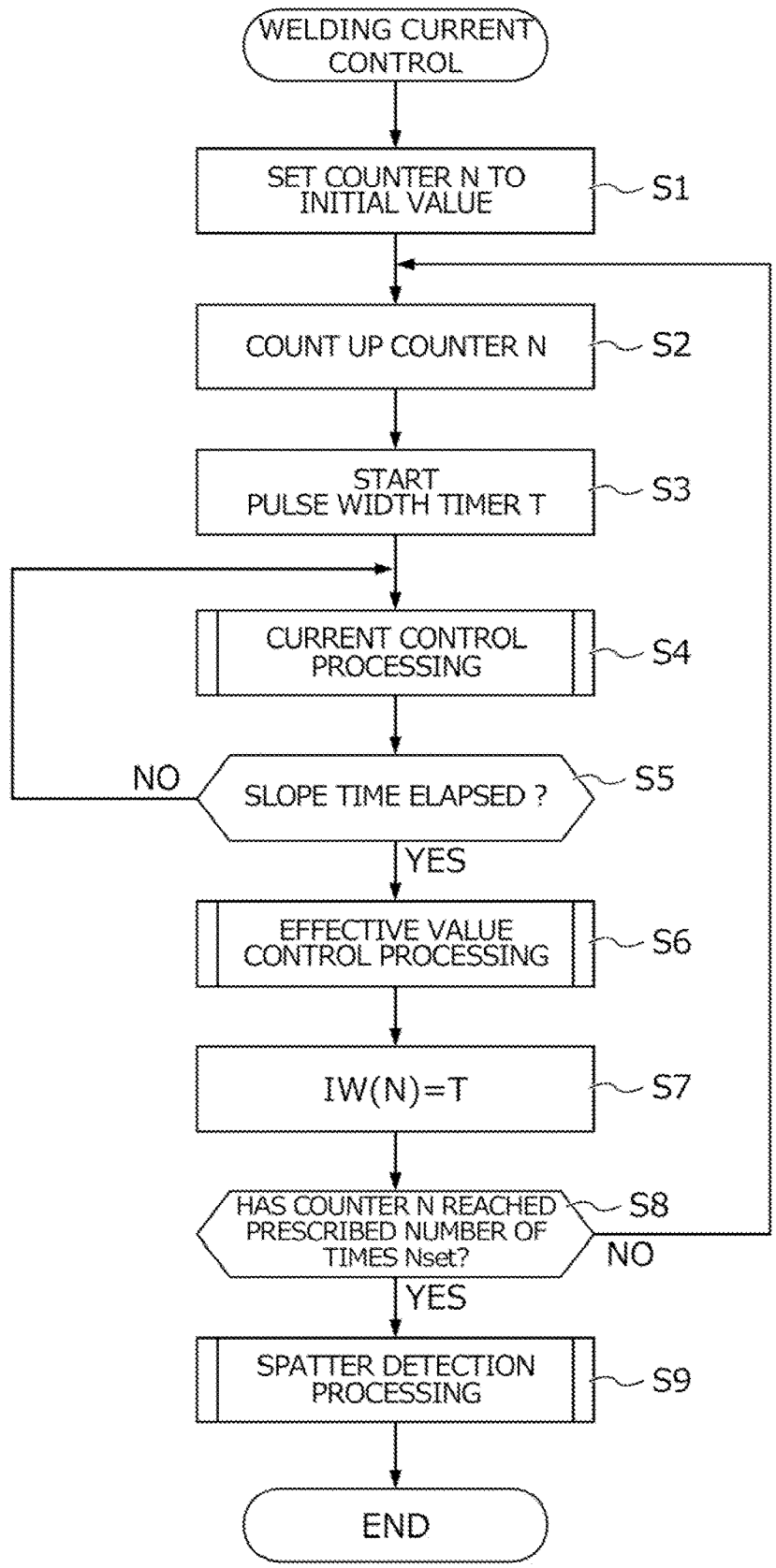
FIG. 5 is a flowchart showing the specific steps of welding current control in a control apparatus.
Figure 6:
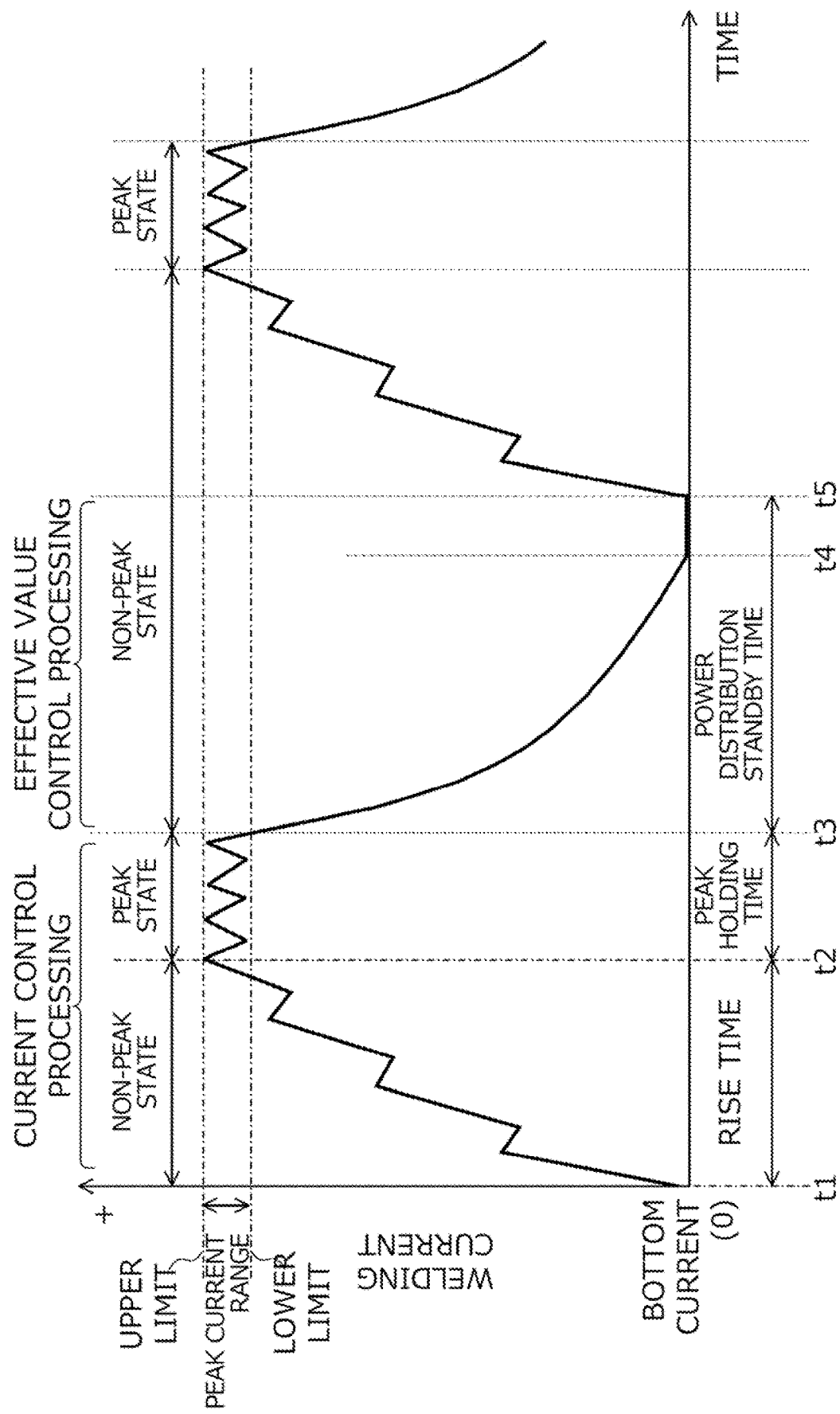
FIG. 6 is a graph showing the waveform of the welding current achieved by the welding current control of FIG. 5.

FIG. 5 is a flowchart showing the specific steps of the welding current control in the control apparatus 33. FIG. 6 is a graph showing the waveform of the welding current achieved by the welding current control of FIG. 5. As shown in FIG. 6, the welding current generated by the welding current control of FIG. 5 has such a pulse-shaped waveform that a peak state in which the welding current reaches or is maintained within a set peak current range and a non-peak state in which the welding current increases to the peak current range again after having decreased to a bottom current (e.g., zero) from the peak current range are alternately achieved. In other words, under the welding current control of FIG. 5, a step of maintaining the welding current within the peak current range and a step of decreasing the welding current from the peak current range toward the bottom current and then increasing the welding current toward the peak current range again are alternately executed for a plurality of cycles (at least two or more cycles), whereby a welding current having a pulse-shaped waveform as shown in FIG. 6 is supplied to the workpiece W.

First, at S1, the control apparatus 33 sets a value of a counter N for counting the number of pulse cycles (number of pulses) of the welding current supplied to the workpiece W to an initial value of 0, and proceeds to S2.

Next, at S2, the control apparatus 33 counts up the counter N by 1 (N=N+1), and proceeds to S3.

Next, at S3, the control apparatus 33 starts a pulse width timer T for measuring a pulse width IW(N) of a welding current pulse for an N-th cycle from a value of 0, and proceeds to step S4.

Next, at S4, the control apparatus 33 executes current control processing, and proceeds to S5. As described later with reference to FIG. 7, in this current control processing, the control apparatus 33 maintains the peak state for a predetermined time after having increased the welding current from the bottom current to the peak current range.

Next, at S5, the control apparatus 33 determines whether or not a predetermined slope time has elapsed. As shown in FIG. 5, this slope time is time obtained in such a manner that a current rise time which is time until the welding current reaches the upper limit of the peak current range from the bottom current and a peak holding time which is time during which the welding current is maintained within the peak current range are added up, and is fixed at a preset time. In other words, the slope time is fixed for the welding current pulse in all cycles. The control apparatus 33 returns to S4 to continuously execute the current control processing in a case where a determination result at S5 is NO, and proceeds to S6 in a case where the determination result at S5 is YES.

Next, at S6, the control apparatus 33 executes effective value control processing, and proceeds to S7. As described later in detail with reference to FIG. 8, in this effective value control processing, the control apparatus 33 puts execution of the current control processing on hold across a standby time (see FIG. 6) set based on an effective value of the welding current.

Next, at S7, the control apparatus 33 stops the pulse width timer T started at S3 and stores a value of the pulse width timer T at this time in a memory (not shown) as a pulse width IW(N) of the welding current pulse for the N-th cycle, and proceeds to S8. In other words, the pulse width IW(N) is equivalent to a time until the effective value control processing for the N-th cycle ends from the start of the current control processing for the N-th cycle (that is, until the start of current control processing for an (N+1)-th cycle). In other words, the pulse width IW(N) is equivalent to a time between time points t1 and t5 in the example of FIG. 6.

Next, at S8, the control apparatus 33 determines whether or not the counter N has reached a predetermined prescribed number of cycles Nset. The prescribed number of cycles Nset corresponds to the number of cycles of the welding current pulse required to join one spot of the workpiece W by the spot welding apparatus 1, and is set in advance according to the thickness and the material characteristics of the workpiece W. When the determination result at S8 is NO, the control apparatus 33 returns to S2, and starts the next current control processing. When the determination result at S8 is YES, the control apparatus 33 proceeds to S9. In the present embodiment, the case has been described in which the welding current is continuously supplied until the number of cycles of the welding current pulse reaches the predetermined prescribed number of cycles Nset, but the present invention is not limited thereto. For example, the welding current may be continuously supplied until a predetermined power distribution time elapses after the start of the welding current control for the first cycle.

Next, at S9, the control apparatus 33 ends the processing of FIG. 5 to start joining a next spot of the workpiece W or another workpiece W after executing the spatter detection processing. As described later in detail with reference to FIG. 9, in such spatter detection processing, the presence or absence of the occurrence of spatter while the welding current is being supplied, the timing of the occurrence of spatter, and the quality of the product due to the occurrence of spatter are determined.

As described above, in the welding current control, the control apparatus 33 repeatedly executes the current control processing (see S4) and the effective value control processing (see S6) across the power distribution time, thereby applying the welding current with the pulse-shaped waveform as shown in FIG. 6 to between the electrode chips 21, 26.

Figure 7:
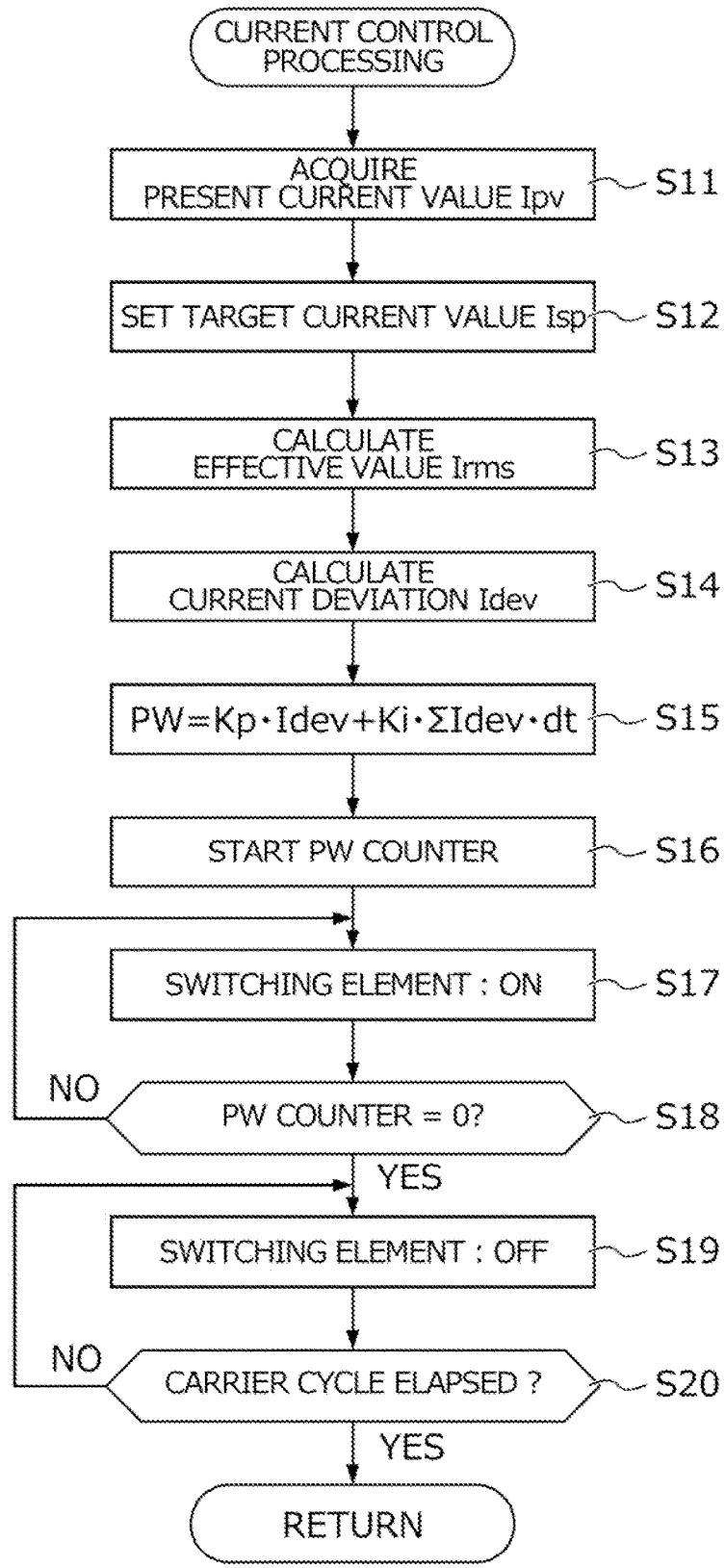
FIG. 7 is a flowchart showing the specific steps of current control processing.

FIG. 7 is a flowchart showing the specific steps of the current control processing. First, at S11, the control apparatus 33 acquires, using the current detection signal transmitted from the current sensor 3d, a present current value Ipv as a present welding current value, and proceeds to S12. At S12, the control apparatus 33 sets a target current value Isp equivalent to a target welding current value, and proceeds to S13. As shown in FIG. 6, the target current value Isp is set between predetermined current rise slopes or between the upper limit and the lower limit of the peak current range.

At S13, the control apparatus 33 calculates an effective value Irms of the welding current by using the present current value Ipv acquired at S11, and proceeds to S14. More specifically, the control apparatus 33 calculates the root-mean-square of the present current value Ipv across time elapsed from the start of the welding current control of FIG. 5 to a present point of time, thereby calculating the effective value Irms.

At S14, the control apparatus 33 calculates a current deviation Idev by subtracting the present current value Ipv acquired at S11 from the target current value Isp set at S12, and proceeds to S15.

At S15, the control apparatus 33 calculates the pulse width PW according to the feedback control rule (specifically, e.g., a PI control rule) based on the current deviation Idev calculated at S14 such that the current deviation Idev reaches zero, and proceeds to S16. More specifically, the control apparatus 33 adds up the result of multiplication of the current deviation Idev by a predetermined proportional gain Kp and the result of multiplication of an integral value of the current deviation Idev by a predetermined integral gain Ki, thereby calculating the pulse width PW.

At S16, the control apparatus 33 starts a PW counter, and proceeds to S17. At S17, the control apparatus 33 turns on the switching elements provided in the inverter circuit 32, and proceeds to S18. At S18, the control apparatus 33 determines whether or not the value of the PW counter reaches zero, i.e., whether or not time equivalent to the pulse width PW has elapsed after the start of the PW counter at S16. The control apparatus 33 returns to S17 to keep the switching elements ON in a case where a determination result at S18 is NO, and proceeds to S19 in a case where the determination result at S18 is YES.

At S19, the control apparatus 33 turns off the switching elements provided in the inverter circuit 32, and proceeds to S20. At S20, the control apparatus 33 determines whether or not the set carrier cycle has elapsed after the switching elements have been turned on at S17. The control apparatus 33 returns to S19 to keep the switching elements OFF in a case where a determination result at S20 is NO, and proceeds to S5 of FIG. 5 in a case where the determination result at S20 is YES.

Figure 8:
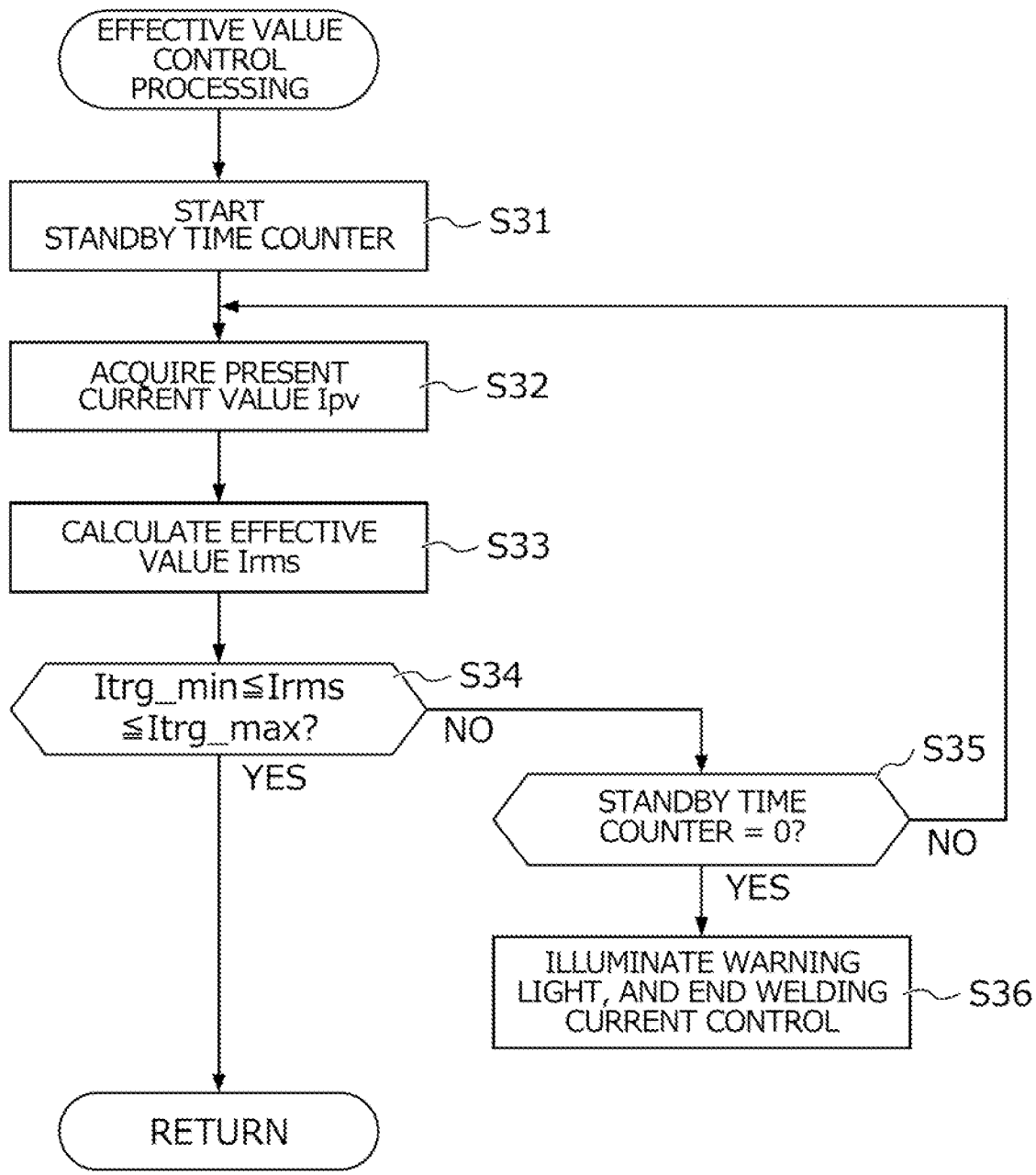
FIG. 8 is a flowchart showing the specific steps of effective value control processing.

FIG. 8 is a flowchart showing the specific steps of the effective value control processing. At S31, the control apparatus 33 starts a standby time counter to measure a power distribution standby time (see FIG. 6) equivalent to an execution time of the effective value control processing, and proceeds to S32. At S32, the control apparatus 33 acquires the present current value Ipv by using the current detection signal transmitted from the current sensor 3d, and proceeds to S33. At S33, the control apparatus 33 calculates, using the present current value Ipv acquired at S32, the effective value Irms of the welding current by the same step as in S13, and proceeds to S34.

At S34, the control apparatus 33 determines whether or not the effective value Irms calculated at S33 reaches within a target effective value range set between a predetermined lower limit Itrg min and a predetermined upper limit Itrg max (Itrg min Irms Itrg max). In a case where a determination result at S34 is YES, the control apparatus 33 starts a subsequent cycle of the current control processing, and proceeds to S7 of FIG. 5 to increase the welding current to the peak current range again.

In a case where the determination result at S34 is NO, the control apparatus 33 proceeds to S35, and determines whether or not the value of the standby time counter started at S31 is zero, i.e., whether or not the power distribution standby time has exceeded a predetermined time. In a case where a determination result at S35 is NO, the control apparatus 33 returns to S32, and waits to start the subsequent cycle of the current control processing until the effective value Irms decreases and reaches within the target effective value range. In a case where the determination result at S35 is YES, i.e., a case where the effective value Irms does not reach within the target effective value range within the predetermined time, the control apparatus 33 proceeds to S36 to inform an operator of occurrence of some types of abnormalities by, e.g., illumination of a warning light and end the welding current control.

Next, the waveform of the welding current generated by execution of the welding current control as described above will be described in detail with reference to FIG. 6.

First, the control apparatus 33 repeatedly executes, between time points t1 to t3, the current control processing shown in FIG. 7 until a lapse of the preset slope time. As described with reference to FIG. 7, in this current control processing, the target current value Isp is set, and the pulse width PW is determined by the PI control such that the present current value Ipv acquired through the current sensor 3d reaches the target current value Isp. The inverter circuit 32 is driven by the PWM control with the pulse width PW. Accordingly, as shown in FIG. 6, the welding current increases from the bottom current to the peak current range after the time point t1, and reaches the upper limit of the peak current range at the time point t2. After the time point t2, the welding current is maintained within the peak current range by the PI control in the control apparatus 33. Thereafter, at the time point t3, the control apparatus 33 ends the current control processing (see S4) according to whether or not the slope time has elapsed after the start of the current control processing at the time point t1 (see S5), and starts the effective value control processing (see S6).

By execution of the current control processing as described above, the welding current maintained within the peak current range is applied to the workpiece W. Thus, as shown in FIG. 4, growth of the nuggets N1, N2 is accelerated between the first metal plate W1 and the second metal plate W2 and between the second metal plate W2 and the third metal plate W3. Here, as shown in FIG. 4, since the thickness of the first metal plate W1 is smaller than each of the thicknesses of the second metal plate W2 and the third metal plate W3, the first metal plate W1 is easily deformed by pressurization. Thus, a contact area between the first metal plate W1 and the second metal plate W2 is larger than a contact area between the second metal plate W2 and the third metal plate W3. Thus, a contact resistance between the first metal plate W1 and the second metal plate W2 is smaller than a contact resistance between the second metal plate W2 and the third metal plate W3. Thus, Joule heat generated due to the contact resistance caused by the flow of welding current is greater at a portion between the second metal plate W2 and the third metal plate W3 than at a portion between the first metal plate W1 and the second metal plate W2. Thus, in the peak state, the growth rate of the nugget N2 generated between the second metal plate W2 and the third metal plate W3 is higher than the growth rate of the nugget N1 between the first metal plate W1 and the second metal plate W2.

Returning to FIG. 6, the control apparatus 33 executes, between the time points t3 to t5, the effective value control processing described with reference to FIG. 8. In this effective value control processing, the control apparatus 33 calculates the effective value Irms of the welding current (see S33), and stops driving the inverter circuit 32 until the effective value Irms reaches within the target effective value range. Thus, after the time point t3, the welding current quickly decreases to the bottom current, and reaches the bottom current at the time point t4. Thereafter, at the time point t5, the control apparatus 33 ends the effective value control processing according to whether or not the effective value Irms has decreased and reached within the target effective value range, and starts the subsequent cycle of the current control processing. Thus, after the time point t5, the welding current increases from the bottom current to the peak current range again.

By execution of the effective value control processing as described above, drive of the inverter circuit 32 is stopped across the power distribution standby time until the effective value Irms of the welding current reaches within the target effective value range. Thus, a state in which the welding current is limited to equal to or lower than the lower limit of the peak current range is maintained during the effective value control processing, and therefore, each of the nuggets N1, N2 generated between the metal plates is cooled by heat dissipation. As described above, the thickness of the first metal plate W1 is smaller than each of the thicknesses of the second metal plate W2 and the third metal plate W3. Thus, heat dissipation between the second metal plate W2 and the third metal plate W3 is smaller than heat dissipation between the first metal plate W1 and the second metal plate W2. While the state in which the welding current is limited to equal to or lower than the peak current range is maintained, the amount of cooling of the nugget N2 by heat dissipation is greater than the amount of cooling of the nugget N1 by heat dissipation. The growth rate of the nugget N2 is higher than the growth rate of the nugget N1 in the peak state as described above. Thus, as described above, the state in which the welding current is limited to equal to or lower than the peak current range is maintained across the power distribution standby time, and cooling of the nugget N2 is accelerated. Consequently, occurrence of spatter between the second metal plate W2 and the third metal plate W3 can be reduced. In the effective value control processing, the subsequent cycle of the current control processing is started according to whether or not the effective value Irms of the welding current has reached within the target effective value range, and the welding current is increased again. Thus, energy necessary for growing each of the nuggets N1, N2 between adjacent ones of the metal plates W1 to W3 can be controlled, and therefore, the workpiece can be reliably joined while occurrence of the spatter is reduced as described above.

Figure 9:
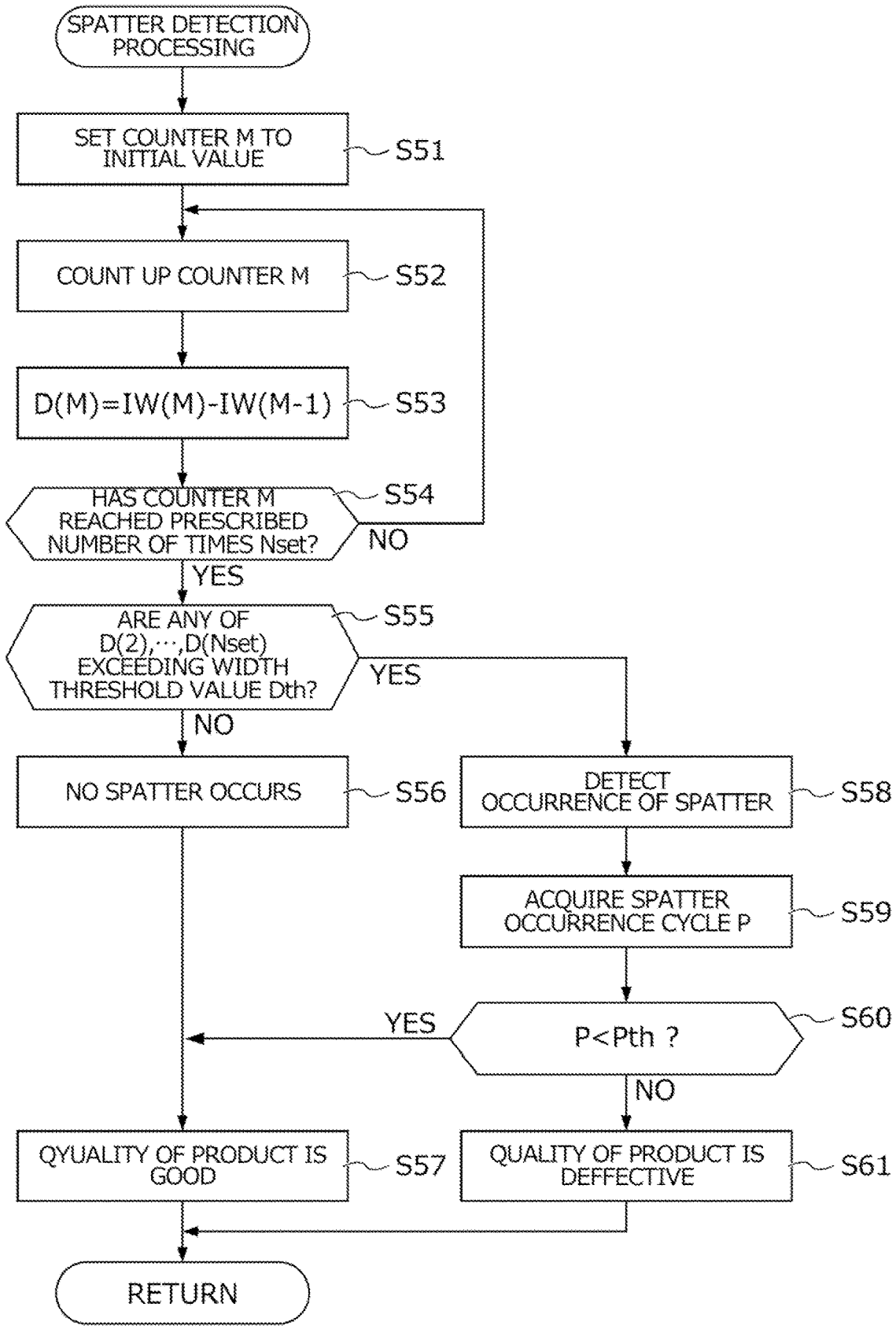
FIG. 9 is a flowchart showing the specific steps of spatter detection processing.
Figure 10:
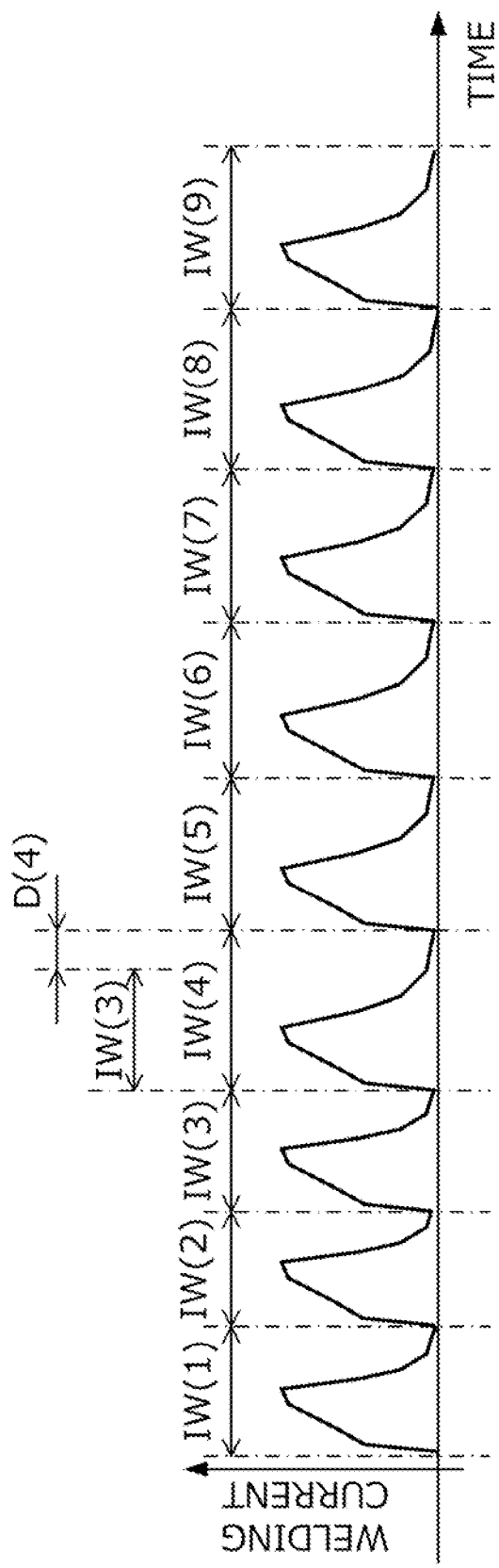
FIG. 10 is a graph showing pulse-shaped waveforms of the welding current for nine cycles.

FIG. 9 is a flowchart showing the specific steps of the spatter detection processing. FIG. 10 is a graph showing pulse-shaped waveforms of the welding current for nine cycles. In addition, FIG. 10 shows a case where the spatter occurs in a fourth cycle.

First, at S51, the control apparatus 33 sets a counter M for counting the number of times of welding current pulses to an initial value of 1, and proceeds to S52.

Next, at S52, the control apparatus 33 counts up the counter M by 1 (M=M+1), and proceeds to S53.

Next, at S53, the control apparatus 33 sets an M-th cycle as a target cycle, and calculates a pulse width difference D(M) of the target cycle, which is a difference between a pulse width IW(M) of a welding current pulse in the target cycle and a pulse width IW(M−1) of a welding current pulse in a cycle (i.e., (M−1)-th cycle) immediately before the target cycle (D(M)=IW(M)−IW(M−1)), and proceeds to S54.

Next, at S54, the control apparatus 33 determines whether or not the counter M has reached a prescribed number of cycles Nset. When the determination result at S54 is NO, the control apparatus 33 returns to S52, and when the determination result at S54 is YES, the control apparatus 33 proceeds to S55.

Next, at S55, the control apparatus 33 determines in order to determine the presence or absence of the occurrence of spatter whether or not there is any one of pulse width differences D(2), . . . , D(Nset) for Nset-1 cycles that exceeds a predetermined width threshold value Dth.

Figure 11:
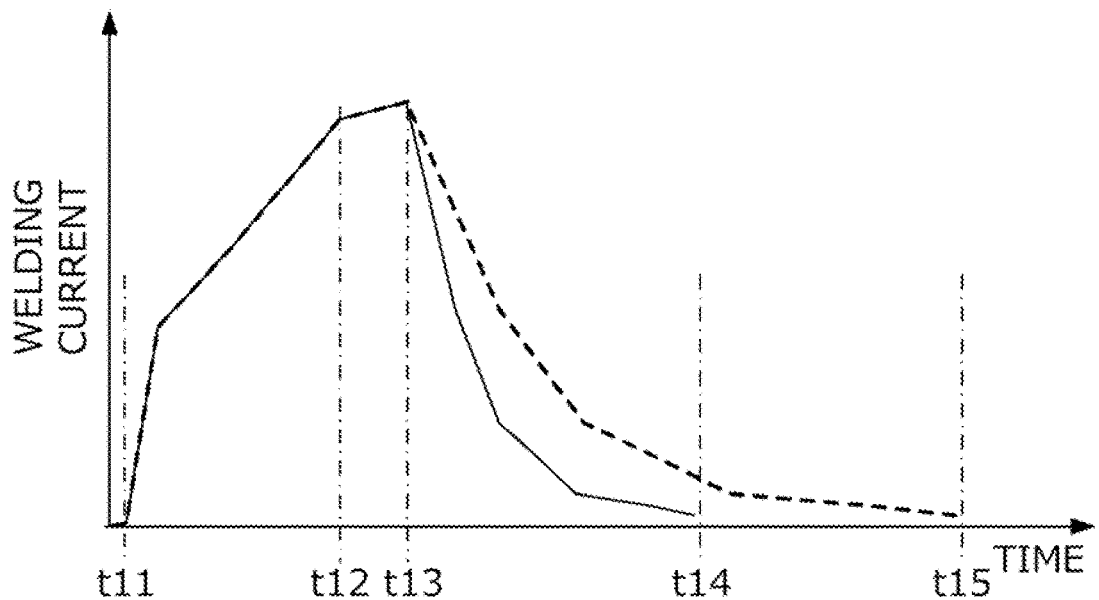
FIG. 11 is a graph schematically showing one cycle of the welding current waveform realized by the welding current control in FIG. 5.

FIG. 11 is a graph schematically showing one cycle of the welding current waveform realized by the welding current control in FIG. 5. In FIG. 11, the welding current waveform in the target cycle is indicated by a dashed line, and the welding current waveform in the cycle immediately before the target cycle is indicated by a solid line.

In the welding current control in FIG. 5 as described above, the slope time is fixed over all cycles, the target cycle and the immediately preceding cycle are equal to each other, the slope time being a combination of the current rise time between time points t11 and t12 and the peak holding time between time points t12 and t13, that is, a time at which the current control processing (see FIG. 7) is executed. On the other hand, since the effective value control processing (see FIG. 8) is executed until the effective value Irms of the welding current in that cycle reaches within the target effective value range, the time until the effective value control processing ends after being started differs between the target cycle (between time points t13 and t15) and the immediately preceding cycle (between time points t13 and t14).

Here, the welding current decreases exponentially under a time constant $\tau(\tau \propto 1/R)$ that inversely proportional to a plate-to-plate resistance R of the workpiece W in the effective value control processing in which execution of the current control processing waits for a waiting time determined based on the effective value of the welding current. For this reason, for example, when the spatter occurs in the target cycle and the plate-to-plate resistance R drops sharply, a current falling time (between the time points t13 and t15) required for the effective value of the welding current to decrease within a target effective value range is longer than a current falling time (between the time points t13 and t14) in the cycle immediately before the spatter occurs. For this reason, the presence or absence of the occurrence of spatter and the timing of the occurrence of spatter can be specified by comparison of the pulse width of the welding current in the target cycle with the pulse width of the welding current in the immediately preceding cycle.

Returning to FIG. 9, when the determination result at S55 is NO, that is, when all of the pulse widths D(2), . . . , D(Nset) for Nset-1 cycles are less than the width threshold value Dth, the control apparatus 33 proceeds to S56, determines that no spatter occurs, and proceeds to S57. At S57, the control apparatus 33 determines that the quality of the product manufactured by joining the workpiece W is good, the processing of FIG. 9 ends.

Further, when the determination result at S55 is YES, that is, when at least one of the pulse widths D(2), . . . , D(Nset) for Nset-1 cycles exceeds the width threshold value Dth, the control apparatus 33 proceeds to S58, determines that a spatter occurs, and proceeds to S59.

At S59, the control apparatus 33 calculates a spatter occurrence cycle P equivalent to a timing at which the spatter occurs, and proceeds to S60. More specifically, the control apparatus 33 acquires a cycle at which any of the pulse widths D(2), . . . , D(Nset) for Nset-1 cycles exceeds the width threshold value Dth, and sets such a cycle as the spatter occurrence cycle P. Here, when there are a plurality of cycles at which any of the pulse widths D(2), . . . , D(Nset) for Nset-1 cycles exceeds the width threshold value Dth, it is preferable to set a cycle, at which the pulse width exceeds the width threshold value Dth at last, as the spatter occurrence cycle P.

At S60, the control apparatus 33 determines in order to determine the quality of the product based on the timing of the occurrence of spatter whether or not the spatter occurrence cycle P is less than a cycle threshold value Pth set from 2 to Nset.

Figure 12:
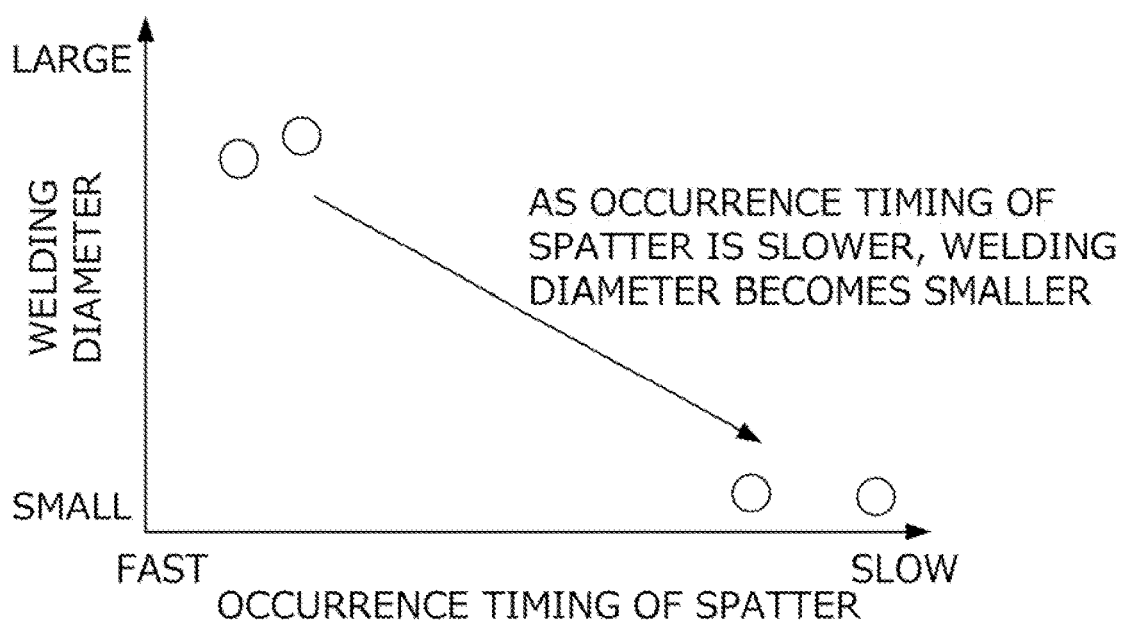
FIG. 12 is a graph showing a correlation between a welding diameter formed when the welding current is continuously supplied over a prescribed cycle and a timing of an occurrence of spatter.

FIG. 12 is a graph showing a correlation between a welding diameter (i.e., welding strength) formed when the welding current is continuously supplied over the prescribed cycle Nset and the timing of the occurrence of spatter. As shown in FIG. 12, the slower the timing of the occurrence of spatter, the smaller the welding diameter formed finally by welding, and accordingly the lower the welding strength. It is considered that this is because when the timing of the occurrence of spatter is at a former period of the welding, the welding diameter can be expected to grow with subsequent power distribution, whereas when the timing of the occurrence of spatter is at a latter period of the welding, the welding diameter does not grow sufficiently due to subsequent power distribution.

Returning to FIG. 9, when the determination result at S60 is YES, that is, when the spatter occurrence cycle P is less than the cycle threshold value Pth, the control apparatus 33 proceeds to S57, determines that the quality of the product is good, and ends the processing of FIG. 9. Further, when the determination result at S60 is NO, that is, when the spatter occurrence cycle P is equal to or greater than the cycle threshold value Pth, the control apparatus 33 proceeds to S61, determines that the quality of the product is defective, and ends the processing of FIG. 9.

In addition, it is preferable to check the quality again by visual inspection when it is determined that the quality of the product is defective by the above-described spatter detection processing.

According to the spatter detection method related to the present embodiment, the following effects are achieved.

(1) When the spatter occurs during the spot welding, the plate-to-plate resistance of the workpiece W drops sharply. Therefore, when the spatter occurs while the workpiece W is joined by supplying the welding current having the pulse-shaped waveform to the workpiece W, the plate-to-plate resistance of the workpiece W drops sharply, and thus the time constant lengthens sharply when the welding current decreases from the peak current range to the bottom current. For this reason, when the welding current having the pulse-shaped waveform is supplied by current control, which causes the welding current to rise toward the peak current range, in the case where the effective value of the welding current reaches the target range, the difference increases between the pulse width of the welding current in the cycle in which the spatter occurs and the pulse width of the welding current in the cycle before the spatter occurs. By utilizing such a phenomenon in the present embodiment, it is possible to detect the occurrence of spatter without newly providing a voltage detection line. In the present embodiment, the occurrence of spatter is detected based on the comparison of the pulse width in the target cycle with the pulse width in the cycle immediately before the target cycle, whereby it is possible to detect the occurrence of spatter without prior knowledge of the difference in material characteristics of the workpiece W to be welded and the influence of the welding equipment.

(2) When the spatter occurrence cycle P is at the former period of the welding prior to the cycle threshold value Pth, since the welding diameter can be expected to grow due to the subsequent power distribution, sufficient welding strength of the product can be ensured. On the other hand, when the spatter occurrence cycle P is at the latter stage of the welding after the cycle threshold value Pth, since the welding diameter cannot be expected to grow due to the subsequent power distribution, the sufficient welding strength of the product may not be ensured. By utilizing such a fact in the present embodiment, the quality of the product is determined based on the spatter occurrence cycle P. Thereby, it is not necessary to visually inspect the quality of all the products, in which the spatter occurs during the welding, again, and thus the number of man-hours for inspection after the welding can be reduced.

(3) When the spatter occurs as described above, the plate-to-plate resistance drops sharply, and thus the current falling time until the welding current decreases from the peak current range to the bottom current lengthens. In the present embodiment, for this reason, the slope time is fixed over all cycles, and thus the change in the current falling time caused by the occurrence of spatter can be reflected in the change in the pulse width, whereby the occurrence of spatter can be detected with higher accuracy, the slope time being a combination of the current rise time until the welding current reaches the peak current range from the bottom current and the peak holding time during which the welding current is maintained within the peak current range.

One embodiment of the present invention has been described above, but the present invention is not limited to above. Detailed configurations may be changed as necessary within the scope of the gist of the present invention.

In the present embodiment, the case has been described in which the spatter detection processing is executed after the welding current is supplied over the prescribed cycle Nset to detect the occurrence of spatter, but the execution timing for the spatter detection processing is not limited thereto. In the spatter detection processing according to the present invention as described above, the occurrence of spatter is detected, based on the comparison of the pulse width of the welding current in the target cycle with the pulse width of the welding current in the immediately preceding cycle, and thus the spatter detection processing may be executed while the welding current is supplied.

What is claimed is:

1. A spatter detection method for detecting an occurrence of spatter in a spot welding method for joining a workpiece by supplying a welding current, wherein
    the spot welding method includes supplying the welding current having a pulse-shaped waveform by alternately executing a step of maintaining the welding current within a set peak current range and a step of decreasing the welding current from the peak current range toward a bottom current and then increasing the welding current toward the peak current range when an effective value of the welding current reaches a set target range for a plurality of cycles,
    the spatter detection method comprising measuring a pulse width in each cycle of the pulse-shaped waveform and detecting the occurrence of spatter when a difference between the pulse width in a target cycle and the pulse width in a cycle immediately before the target cycle exceeds a predetermined width.

2. The spatter detection method according to claim 1, further comprising, when the occurrence of spatter is detected, estimating a quality of a product manufactured by welding the workpiece based on a timing at which the occurrence of the spatter is detected.

3. The spatter detection method according to claim 1, wherein the spot welding method includes fixing a slope time, which is a combination of a current rise time until the welding current reaches the peak current range from the bottom current and a peak holding time during which the welding current is maintained within the peak current range.

4. The spatter detection method according to claim 2, wherein the spot welding method includes fixing a slope time, which is a combination of a current rise time until the welding current reaches the peak current range from the bottom current and a peak holding time during which the welding current is maintained within the peak current range.

* * * * *